United States Patent [19]

Shimose et al.

[11] Patent Number: 5,324,087
[45] Date of Patent: Jun. 28, 1994

[54] SUCKED SUBSTRATE DETECTING APPARATUS

[75] Inventors: Yuichiro Shimose, Tokyo; Jiro Ikeda, Fujieda, both of Japan

[73] Assignees: Sony Corporation; Kabushiki Kaisha Shibaura Seisakusho, Japan

[21] Appl. No.: 15,888

[22] Filed: Feb. 10, 1993

Related U.S. Application Data

[63] Continuation of Ser. No. 689,484, Apr. 23, 1991, abandoned.

[30] Foreign Application Priority Data

Apr. 27, 1990 [JP] Japan .................................. 2-112582

[51] Int. Cl.⁵ .................................................. B66K 1/02
[52] U.S. Cl. .................................... 294/64.1; 294/907
[58] Field of Search .............. 294/64.1, 907; 414/627, 414/737, 752

[56] References Cited

U.S. PATENT DOCUMENTS

| | | | |
|---|---|---|---|
| 3,008,747 | 11/1961 | Lytle | 294/64.1 |
| 3,485,393 | 12/1969 | Wilder | 214/89 |
| 4,047,532 | 9/1977 | Phillips et al. | 294/64.1 X |
| 4,557,659 | 12/1985 | Scaglia | 294/64.1 X |
| 4,589,648 | 5/1986 | Hancock | 294/64.1 X |
| 4,799,854 | 1/1989 | Niskala | 294/64.1 X |
| 5,033,730 | 7/1991 | Davies et al. | 294/64.1 X |

FOREIGN PATENT DOCUMENTS 0269128 6/1988 European Pat. Off. .
254436 11/1986 Japan ................................. 294/907

Primary Examiner—Joseph D. Pape
Attorney, Agent, or Firm—Wigman, Cohen, Leitner & Myers

[57] ABSTRACT

A sucked substrate detecting apparatus is provided which comprises sucking pads for sucking disk substrates, a main pipe connected to the sucking pads, a vacuum pump connected through a first valve to the main pipe, first and second branch pipes connected respectively to the main pipe, a second valve connected to the first branch pipe, for opening and closing with respect to the atmosphere, a pressure sensor connected to the second branch pipe, for substantially detecting the pressure in the main pipe, and a controller connected to the first and second valves. The sucked substrate detecting apparatus can judge on the basis of the output levels produced from the pressure sensor, the presence or absence of a disk substrate sucked by the sucking pads and whether or not the disk substrate has been satisfactorily sucked by the sucking pads.

4 Claims, 2 Drawing Sheets

SUCKED SUBSTRATE DETECTING APPARATUS

This is a continuation of co-pending application Ser. No. 07/689,484 filed on Apr. 23, 1991 now abandoned.

BACKGROUND OF THE INVENTION

1. Field of the Invention

This invention relates to a sucked substrate detecting apparatus, and more particularly to an apparatus for transferring substrates by use of a vacuum suction technique.

2. Description of the Prior Art

In recent years, a compact disk (hereinafter, referred to as a CD) has been widely used to record a large amount of digitized sound and image information. The substrate of the CD is generally made of transparent synthetic resin (polycarbonate and the like). A large number of pits are formed on the substrate surface in accordance with the digitized information ("1" or "0") to be recorded. Further, an aluminum thin film layer having a high light-reflectivity is formed on the substrate surface by use of a sputtering technique. The digital information recorded by the arrangement of the pits can be read by recognizing the presence or absence of the reflected light of a laser light beam applied to the CD.

The aluminum thin film can be formed by sputtering on the surface of a single substrate in a relatively short time. Thus, a continuous sputtering system has been used in which the aluminum thin film can be continuously formed on a large number of substrates. In the continuous sputtering system, a vacuum suction transferring apparatus has been employed which can minimize damage to the substrates in the processes of transferring the substrates to be sputtered into a sputtering apparatus from the outside of the continuous sputtering system and also processes of transferring the sputtered substrates to the outside. A conventional vacuum suction substrates to the outside. A conventional vacuum suction apparatus is shown in FIG. 4. In FIG. 4, a substrate 41 is being sucked by sucking pads 42. The sucking pads 42 are connected through a main pipe 43 and a first valve 44 to a vacuum pump 45. Further, a branch pipe 46, which communicates with the atmosphere through a second valve 47, is connected to the main pipe 43 at a portion between the sucking pads 42 and the first valve 44. The open-and-close operations of the first and second valves 44 and 47 are controlled in accordance with control signals produced from a controller 48. In this vacuum suction apparatus, when the substrate 41 is sucked by the sucking pads 42, the second valve 47 is closed to isolate the atmosphere, and the first valve 44 is opened so as to exhaust the air from the main pipe 43 by use of the vacuum pump 45. To the contrary, when the substrate 41 is released from the sucking pads 42, the first valve 44 is closed, and then the second valve 47 is opened so as to communicate with the atmosphere.

In the continuous sputtering system, it is important to confirm whether or not a large number of substrates are being smoothly transferred, i.e., to confirm whether or not the substrate 41 is being satisfactorily sucked by the sucking pads 42. A conventional substrate detecting apparatus comprises a light generator 49 and a reflected light detector 50 which are provided in the vicinity of the sucking pads 42, as shown in FIG. 4. A light beam 51 produced from the light generator 49 is applied to the surface of the substrate 41 being captured by the sucking pads 42. A light beam 52 reflected from the surface of the substrate 41 is detected by the reflected light detector 50. As a result, the substrate 41 being captured by the sucking pads 42 can be confirmed. The above-described substrate detecting apparatus is of a light reflecting type utilizing a light reflecting film (made of aluminum and the like) formed on surface of the substrate 41. Besides this, there is a light penetrating-type substrate detecting apparatus in which the sucked substrate can be recognized by the presence or absence of the penetrating light. However, both the types of the substrate detecting apparatus can merely detect whether or not the substrate 41 has been captured by the sucking pads 42 and physically exists.

Therefore, in the above-described conventional substrate detecting apparatus, the detection of the physical existence of the substrate 41 on the sucking pads 42 does not necessarily indicate that the substrate 41 has been satisfactorily sucked by the sucking pads 42. For example, even when a foreign substance has been interposed between the substrate 41 and the sucking pads 42, the conventional substrate detecting apparatus detects this as if the substrate 41 had been satisfactorily sucked by the sucking pads 42. Thus, the substrate 41, which has been unsatisfactorily sucked by the sucking pads 42, is transferred without any adjustment into the subsequent transferring process. As a result, the substrate 41 might fall off the sucking pads 42 or might be dislocated. This prevents the maintenance of the normal film-formation processes, and causes the failure in the system. Further, in general, the continuous sputtering film-formation is successively performed with an operation period of about 6 seconds. This means that the damage caused by the unsatisfactory substrate-sucking state is not limited to the corresponding substrate alone, but also to the entire operations of the continuous sputtering system. Such disadvantages are not limited to the single-CD processing system.

SUMMARY OF THE INVENTION

Accordingly, one object of the present invention is to provide a sucked substrate detecting apparatus capable of not only detecting the mere existence of a substrate on the sucking pads, but also judging whether or not the substrate has been satisfactorily captured by the sucking pads.

Briefly, in accordance with one aspect of the present invention, there is provided a sucked substrate detecting apparatus which comprises sucking pads for sucking substrates, a pipe connected to the sucking pads, a vacuum pump connected through a valve to the pipe, and a pressure sensor connected to the pipe at a portion between the sucking pads and the vacuum pump, for detecting the pressure in the pipe, the apparatus distinguishing the existence of a substrate sucked by the sucking pads and a state in which the substrate is being sucked by the sucking pads.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
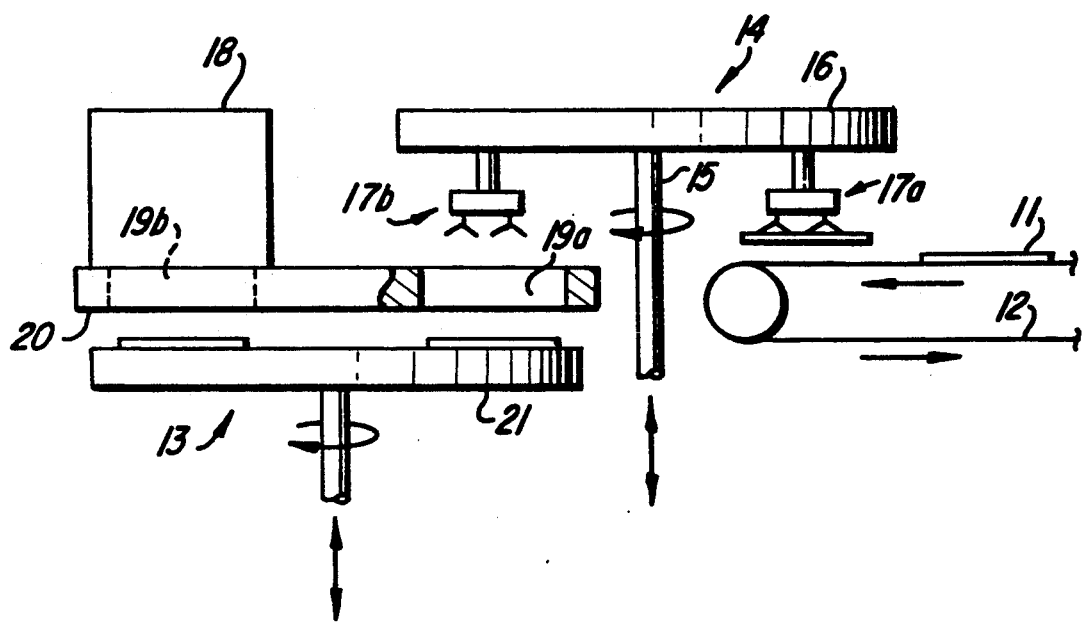
FIG. 1 is a diagram illustrating a schematic configuration of a substrate processing system to which the present invention is applied.

Referring now to the drawings, wherein like reference numerals designate identical or corresponding parts throughout the several views, and more particularly to FIG. 2 thereof, one embodiment of this invention will be described.

Prior to description of one embodiment according to the present invention, the outline of the processes of manufacturing CDs will be described for the sake of the following explanation. First, disk substrates are produced by molding by use of polycarbonate pellets as material. Each surface of the thus molded disk substrates has pit-lines thereon representing recorded information. The molded disk substrates are inspected in a prescribed manner. After the inspection, the disk substrates are transferred into a sputtering system by use of a conveyor apparatus. In the sputtering system, an aluminum thin film is formed on each surface having pit-lines thereon of the disk substrates. After the completion of the sputtering process, the sputtered disk substrates are again conveyor-transferred to a protective film-coating process. Thereafter, the disk substrates, which have been substantially finished as CDs, are sequentially transferred to the following processes. Specifically, there are a function testing process in which the characteristics of reproducing the recorded information are tested, a label screen printing process, a packaging process, and finally the shipment.

FIG. 1 shows a schematic configuration of a sputtering system, to which the present invention is applied, and the peripheral apparatus there of.

The sputtering system is employed in the above-described processes of manufacturing CDs, particularly in the sputtering process. In FIG. 1, molded disk substrates 11 are transferred by a belt conveyor 12 to a position in the vicinity of a sputtering system 13. The sputtering system 13 is disposed in the neighborhood of the belt conveyor 12, however, there is a prescribed distance therebetween. As described above, in the CD disk manufacturing processes, a large number of disk substrates are continuously manufactured throughout the entire processes. Thus, the reception and delivery of the disk substrates must be performed continuously and assuredly before and after the sputtering process as well as other processes.

A rotatable transferring apparatus 14 is provided between the belt conveyor 12 and the sputtering system 13. The rotatable transferring apparatus 14 serves to continuously transfer the disk substrates 11, which have been successively transferred by the belt conveyor 12, to the sputtering system 13. Further, the apparatus 14 also serves to continuously transfer the disk substrates 11, which have been sputtered, from the sputtering system 13 to a subsequent process (not shown). The rotatable transferring apparatus 14 comprises a rotating shaft 15 which is rotatable and also vertically movable, a disk-shaped supporting member 16 attached to the upper end of the rotating shaft 15, and first and second sucking units 17a and 17b. The first and second sucking units 17a and 17b are disposed at positions which are on a straight line under the disk-shaped supporting member 16 and are equally separated from the rotating shaft 15. The disk-shaped supporting member 16 is not limited to be disk-shaped, but may also be an oblong supporting member. In this embodiment, two sucking units 17a and 17b are employed, however, a single sucking unit or three or more sucking units may also be employed. When the disk substrate 11 reaches a position just under the first sucking unit 17a, the rotatable transferring apparatus 14 moves downward so that contact is just made between the first sucking unit 17a and the disk substrate 11. The first sucking unit 17a is evacuated so as to suck the disk substrate 11. Thus, the disk substrate 11 is captured by the first sucking unit 17a. Thereafter, the rotatable transferring apparatus 14 moves upward, and rotates by an angle of about 180° (or 120°). As a result, the disk substrate 11, which has been captured by the first sucking unit 17a, is transferred to a position over the sputtering system 13.

The sputtering system 13 comprises a sputtering source 18, a shield member 20 and a rotating susceptor member 21 which is rotatable and vertically movable. The shield member 20 has an opening 19a through which an object to be sputtered is received and a sputtered object is taken out, and an opening 19b through which the sputtering process is performed. The rotating susceptor member 21 is disposed in a vacuum chamber (not shown). Thus, the opening 19a has a structure such that the degree of vacuum in the vacuum chamber is not decreased even when an object to be sputtered (i.e., the disk substrate) is transferred into the sputtering system 13 and when the sputtered disk substrate is taken out therefrom. The disk substrate 11, which has been captured by the sucking unit 17a, is transferred by the rotating shaft 15 to a position over the sputtering system 13, and is then transferred into the sputtering system 13 through the opening 19a by use of the rotating shaft 15 moving downward. In this case, the susceptor 21 is also moved upward so as to receive the thus transferred disk substrate 11. The vacuum suction of the sucking unit 17a is ceased, and the sucked disk substrate 11 is released and then placed on the susceptor 21. The susceptor 21 is moved downward, and rotated so as to transfer the disk substrate 11 placed thereon to a position under a sputtering source 18, and then the sputtering process is performed. After the completion of the sputtering process, the sputtered disk substrate 11 is transferred back to a position under the opening 19a. The disk substrate 11 is again captured by the sucking unit 17a through the opening 19a. This is performed in a manner opposite to the above-described transfer-in process. The disk substrate 11 captured by the sucking unit 17a is transferred to a subsequent process (not shown). Each of the first and second sucking units 17a and 17b incorporates a vacuum suction-release apparatus (which will be later described in detail), and a novel sucked substrate detecting apparatus according to the present invention, which can accurately detect whether or not the vacuum suction is being normally performed.

Figure 2:
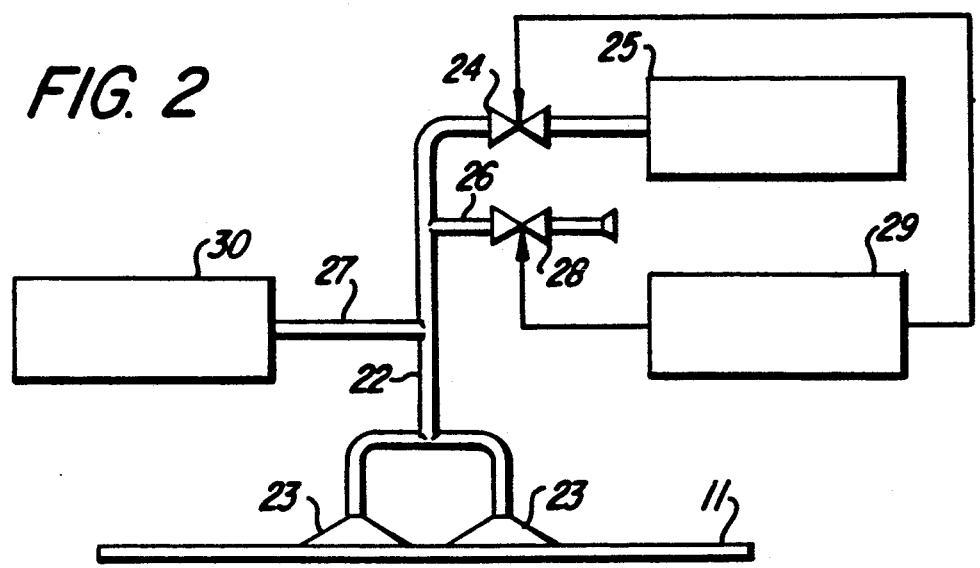
FIG. 2 is a diagram illustrating a schematic configuration of an essential portion of one embodiment according to the present invention.

FIG. 2 shows the configuration of a sucked substrate detecting apparatus according to the present invention, which is in incorporated in the sucking unit 17a alone. However, the sucking unit 17b also incorporates the same configuration as that shown in FIG. 2. In FIG. 2, a plurality of sucking pads 23 made of elastic material are provided at the end of a main pipe 22. A vacuum pump 25 is connected through a first valve 24 to the main pipe 22. When the sucking pads are evacuated by use of the vacuum pump 25, the disk substrate 11 is sucked. The main pipe 22 is provided with first and second branch pipes 26 and 27. The first branch pipe 26 is communicated with the atmosphere through a second valve 28. A controller 29 serves to control the open-and-close operations of the first and second valves 24 and 28. Further, a pressure sensor 30 is connected to the second branch pipe 27. The pressure sensor 30 serves to detect the changes of pressure in the main pipe 22. Specifically, the pressure sensor 30 can accurately detect the difference between a pressure while the disk substrate 11 is being normally sucked by the sucking pads 23 and a pressure when an undesirable gap has occurred between the sucking pads 23 and the disk substrate 11. Such an undesirable gap is caused by a foreign substance interposed between the sucking pads 23 and the disk substrate 11, or by the dislocation of the disk substrate 11. Thus, the difference of pressure in the main pipe 22 detected by the pressure sensor 30 can be used to judge whether or not the disk substrate 11 is being satisfactorily sucked. In the substrate sucking operation, the second valve 28 is closed so as to isolate the atmosphere, and the first valve 24 is opened, and then the vacuum pump 25 is operated. In the substrate releasing operation, contrary to the above, the first valve 24 is closed, and the second valve 28 is opened so that the main pipe 22 is communicated with the atmosphere.

Figure 3:
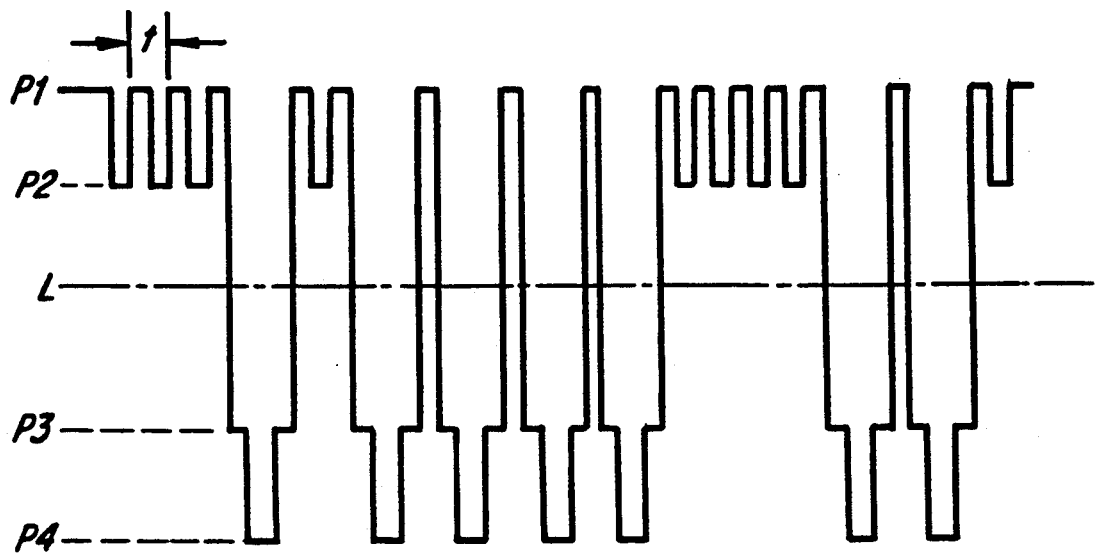
FIG. 3 is a graph illustrating the pressure characteristics detected by a sucked substrate detecting apparatus according to one embodiment of the present invention.
Figure 4:
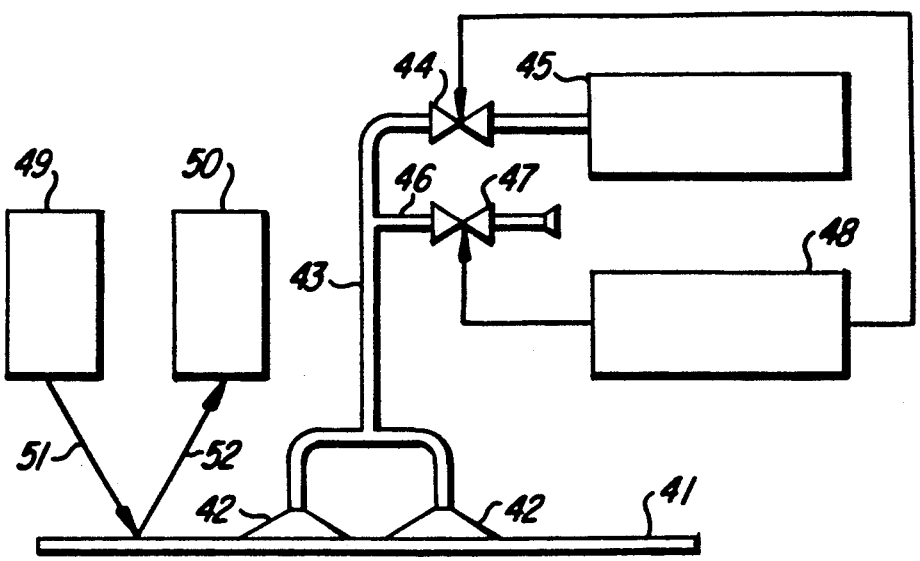
FIG. 4 is a diagram illustrating a conventional sucked substrate detecting apparatus.

Next, the operation of the first sucking unit 17a shown in FIG. 2 will be described in more detail with reference to FIG. 3 illustrating the pressure characteristics in the main pipe 22. Specifically, while the first sucking unit 17a is not sucking the disk substrate 11, i.e., while the sucking pads 23 are in the open state, the first valve 24 is opened and closed with a period of about 1 second in accordance with control signals produced from the controller 29 so as to perform intermittent sucking operations. Thus, while the disk substrate 11 is not being sucked by the sucking pads 23, exhaust ON-OFF operations are performed with a short period of t (e.g., t=1 second). As a result, the pressure sensor 30 detects pressures P1 and P2, as shown in FIG. 3. Namely, the repetitive pressure signals are produced between P1, which is the atmospheric pressure, and P2 which is a pressure slightly reduced while the first valve 24 is being opened. in this case, the second valve 28 is being closed in accordance with the control signal produced from the controller 29. If the disk substrate 11 is normally sucked and satisfactorily captured by the sucking pads 23, the pressure in the main pipe 22 is abruptly reduced to a pressure P3 by the exhaust with the vacuum pump 25, as shown in FIG. 3. Assume that the disk substrate 11 is transferred into the vacuum chamber, and is released from the sucking unit 17a, and then placed on the susceptor 21 (refer to FIG. 1). In this case, the pressure in the main pipe 22 is reduced to P4, which is the same pressure as that in the vacuum chamber, and the lowest pressure in the main pipe 22, as shown in FIG. 3. The pressure sensor 30 can detect the change of the pressures P1 or P2 to P3 while comparing these with a predetermined threshold value L. Thus, the pressure sensor 30 can judge whether or not the disk substrate 11 has been satisfactorily captured by the sucking pads 23.

More specifically, assume that the disk substrate 11 has been unsatisfactorily captured by the sucking pads 23, and an undesirable gap exists therebetween. In this case, despite the prescribed exhaust by use of the vacuum pump 25, the pressure in the main pipe 22 is not sufficiently reduced. When the pressure sensor 30 detects that the pressure in the main pipe 22 has not reached a value lower than the threshold value L, this detection can be judged as a state in which the disk substrate 11 has been unsatisfactorily sucked by the sucking pads 23. In the above-described sucked substrate detecting apparatus according to the present invention, the presence or absence of the disk substrate which has been captured by the sucking pads can be naturally detected. In addition, the apparatus can also judge whether or not the disk substrate has been satisfactorily captured by the sucking pads on the basis of the pressures in the main pipe detected by the pressure sensor connected thereto. The results of such judgement can be effectively utilized to achieve the optimum transferring processes and sputtering process, and also to prevent an unexpected accident or failure in the continuous sputtering system.

Moreover, as described above, the open-and-close operations of the first valve 24 are intermittently performed in accordance with the control signals produced from the controller 29. Thus, the pressure in the main pipe 22 changes repeatedly between P1 and P2, as shown in FIG. 3. This is significantly advantageous in the following. Specifically, assume that the disk substrate 11 were temporarily sucked in an unsatisfactory state. In this case, the disk substrate 11 over the sucking pads 23 moves in an oscillatory motion caused by the repeatedly changed pressures in the main pipe 22. As a result, the disk substrate 11 over the sucking pads 23 can be automatically adjusted so as to be satisfactorily captured by the sucking pads 23.

Hereinbefore, one embodiment according to the present invention has been described as to the application to the sputtering process of CD disk substrates. However, the present invention is not limited to this, but may also be advantageously applied to the handling process of various objects, i.e., not only disk-shaped objects but also three-dimensional objects. Further, the present invention can be widely used in processes or systems in which objects are transferred or captured by use of a vacuum suction technique. For example, the present invention can be applied to various processing systems or transferring processes with respect to semiconductor wafers.

Obviously, numerous additional modifications and variations of the present invention are possible in light of the above teachings. It is therefore to be understood that within the scope of the appended claims, the invention may be practiced otherwise than as specifically described herein.

What is claimed is:

1. A sucked substrate detecting apparatus comprising:
   a) a sucking pad for sucking substrates by a vacuum;
   b) a pipe connected to the sucking pad;
   c) a vacuum pump connected through a valve to the pipe;
   d) a pressure sensor connected to the pipe at a position between the sucking pad and the vacuum pump to sense pressures P1 and P2 in the pipe; and
   e) controller means for switching the valve to control opening and closing operations of the valve, said controller further comprising:

i) means for setting a predetermined pressure level L in accordance with a vacuum pressure P3 in the pipe;

ii) means for intermittently opening and closing said valve according to control signals produced from said controller, and iii) means for holding the valve open according to a pressure P4 lower than the predetermined pressure level L.

2. The sucked substrate detecting apparatus of claim 1, wherein said valve is a first valve and said pipe is a first pipe, further comprising a branch pipe communicating with the atmosphere through a second valve; and wherein the controller is connected to the first valve and to the second valve, the controller being operatively connected to open and close the valves.

3. A sucked substrate detecting apparatus comprising:

a) a sucking pad for sucking substrates by a vacuum;

b) a main pipe connected to the sucking pad;

c) a vacuum connected through a first valve to the main pipe;

d) first and second branch pipes, respectively, connected to the main pipe;

e) a second valve operatively connected to open and close the first branch pipe with respect to the atmosphere;

f) a pressure sensor connected to the second branch pipe, for sensing pressure in the main pipe;

g) a controller including means for judging i) the presence or absence of a sucked substrate at the sucking pad, and ii) whether the substrate is satisfactorily captured by the sucking pad, on the basis of the pressure in the main pipe; and h) vacuum control means for intermittently opening and closing the first valve according to the pressure in the main pipe when the sucking pad sucks a substrate to be sucked.

4. The sucked substrate detecting apparatus of claim 3, wherein the sucking pad is fixed to the end of the main pipe, and further including means for attaching and detaching the substrate both in the atmosphere and in the vacuum chamber.

* * * * *